United States Patent
Hasegawa et al.

(10) Patent No.: US 7,196,412 B2
(45) Date of Patent: Mar. 27, 2007

(54) MULTI-CHIP PRESS-CONNECTED TYPE SEMICONDUCTOR DEVICE

(75) Inventors: Shigeru Hasegawa, Kanagawa (JP); Hideaki Kitazawa, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/926,071

(22) Filed: Aug. 26, 2004

(65) Prior Publication Data

US 2005/0087865 A1    Apr. 28, 2005

(30) Foreign Application Priority Data

Aug. 28, 2003  (JP)  ............................. 2003-304381

(51) Int. Cl.
   *H01L 23/10*  (2006.01)
   *H01L 23/34*  (2006.01)
(52) U.S. Cl. ............... 257/707; 257/688; 257/706; 257/723; 257/727
(58) Field of Classification Search ............... 257/181, 257/688, 150, 706, 707, 719, 727, 723, 724, 257/594
See application file for complete search history.

(56) References Cited

U.S. PATENT DOCUMENTS

| | | | | |
|---|---|---|---|---|
| 5,221,851 A | * | 6/1993 | Gobrecht et al. | ............ 257/177 |
| 5,610,439 A | * | 3/1997 | Hiyoshi et al. | ............. 257/688 |
| 5,708,299 A | * | 1/1998 | Teramae et al. | ..... 257/E23.078 |
| 5,866,944 A | * | 2/1999 | Hiyoshi et al. | ............. 257/719 |
| 5,990,501 A | * | 11/1999 | Hiyoshi et al. | ............. 257/181 |
| 6,281,569 B1 | * | 8/2001 | Sugiyama | ................... 257/688 |
| 6,373,129 B1 | * | 4/2002 | Yamazaki et al. | .......... 257/688 |
| 2002/0038873 A1 | * | 4/2002 | Hiyoshi | ...................... 257/197 |

FOREIGN PATENT DOCUMENTS

JP  2003-7968  1/2003

* cited by examiner

Primary Examiner—S. V. Clark
(74) Attorney, Agent, or Firm—Oblon, Spivak, McClelland, Maier & Neustadt, P.C.

(57) ABSTRACT

A multi-chip press-connected type semiconductor device comprises: a plurality of active element chips to control an electric current flowing in one direction; a plurality of diode chips that transmit the current in a direction opposite to the current transmitting direction of said active element chip; and electrode plates for said active element chip and for said diode chip, said electrode plates pressing from above and under with said plurality of active element chips and said plurality of diode chips being interposed therebetween; wherein said diode chips are disposed in all of outermost peripheral chip positions with no-existence of other chips adjacent to at least one side of a chip in a chip disposing region, and are disposed in internal layout positions surrounded with the outermost peripheral chip positions, and said diode chips to be disposed in the internal layout positions are arranged in order of a total number of other chips from the smallest that exist adjacently to at least one of a side and a vertex of a chip.

24 Claims, 4 Drawing Sheets

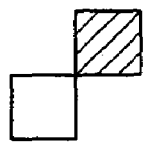  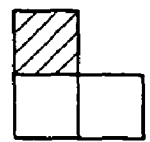 
FIG. 2A     FIG. 2B     FIG. 2C     FIG. 2D
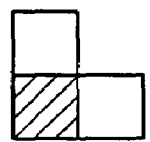 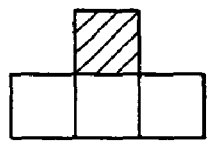 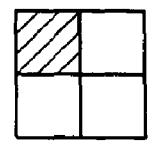 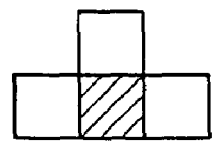
FIG. 2E     FIG. 2F     FIG. 2G     FIG. 2H
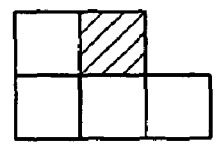 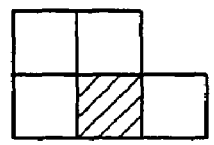 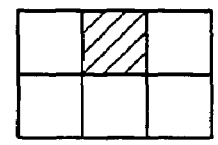 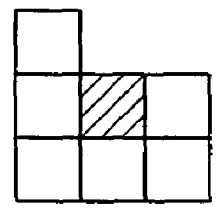
FIG. 2J     FIG. 2K     FIG. 2L     FIG. 2M
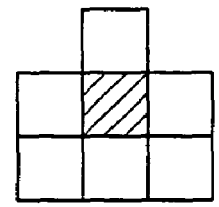 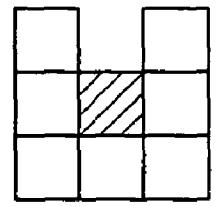 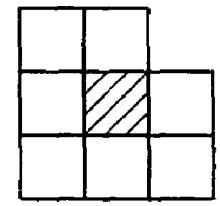 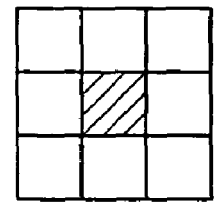
FIG. 2N     FIG. 2P     FIG. 2Q     FIG. 2R

MULTI-CHIP PRESS-CONNECTED TYPE SEMICONDUCTOR DEVICE

CROSS REFERENCE TO RELATED APPLICATIONS

This application is based upon and claims the benefit of priority from the prior Japanese Patent Application No. 2003-304381, filed on Aug. 28, 2003; the entire contents of which are incorporated herein by reference.

BACKGROUND OF THE INVENTION

The present invention relates generally to a press-connected type semiconductor device, and more particularly to a multi-chip press-connected type semiconductor device including a plurality of semiconductor chips.

An IGBT defined as a MOS gate drive type switching device is widely employed as one of semiconductor devices for power control, and an FRD (fast recovery diode) mix-mounted IGBT serving to make full use of the characteristic thereof is known as one example of a multi-chip press-connected type semiconductor device.

The multi-chip press-connected type semiconductor device is a semiconductor device contrived to improve a rated value in a way that establishes an inverse parallel connection between electrodes of both of an IGBT chip and a free wheel diode chip (or FRD chip) by applying a pressure to between electrode plates after disposing the IGBT chip and the FRD chip.

This type of semiconductor device is now described in detail. A chip frame composed of a synthetic resin is attached to respective terminal portions of a plurality of chips, and the chips are arrayed on the same plane so as to abut on this chip frame each other. A first electrode plate and a second electrode plate are disposed on both of surface sides thereof and press-fixed to an electrode of each chip by pressing the electrode plates against the chip, thereby establishing the electric connection with reduced loss.

FIG. 8 is a schematic diagram showing a layout of the chips disposed on a disk-shaped heat buffer plate 108 in the multi-chip press-connected type semiconductor device. Referring to FIG. 8, respective sections represent IGBT chips and FRD chips, and there is shown a state of being attached with a holder that will hereinafter be described.

The layout of the chips in the conventional device illustrated in FIG. 8 is that the IGBT chips and the FRD chips are so disposed that chips are dispersed to the greatest possible degree as to be accommodated within the disk-shaped heat buffer plate 108 for the purpose of taking an exothermic balance between the case of electrifying only the IGBT chips and the case of electrifying only the diode chips.

A numerical quantity and the layout of the IGBT chips and the FRD chips can be arbitrarily selected according to required rating, however, an allocation of the numerical quantity of the chips within one single device is set, wherein the number of the IGBT chips is normally larger than the number of the FRD chips in order to enhance a current cut-off capability as in the form of the device.

Herein, an IGBT device has twenty-one pieces of layout sections, wherein thirteen sections are given to the IGBT chips, and eight sections are given to the FRD chips. Chip layout positions are allocated such that the numbers are given sequentially from an upper left to the right side in FIG. 8, and, when reaching the right end, the subsequent numbers are given from the left end in the next row. In this example, the chip numbers 1, 3, 4, 6, 8, 9, 11, 13, 14, 16, 18, 19 and 21 represent totally thirteen pieces of IGBT chips, and the chip numbers 2, 5, 7, 10, 12, 15, 17 and 20 (indicated by hatching) represent totally eight pieces of FRD chips. It can be understood that the IGBT chip and the FRD chip are alternately arranged in each row when paying attention to every row-direction.

FIG. 9 is a sectional view taken along the line A–A' in FIG. 8, showing a structure. The IGBT chips 101 and the FRD chips 102 are mounted respectively on separation type heat buffer plates 103. In this state, a collector electrode is provided on an upper surface of the IGBT chip 101, and a cathode electrode is provided on an upper surface of the FRD chip 102.

Further, a plastic holder 104 for acquiring a chip-to-chip withstand voltage is fitted into a side terminal portion of each chip, thereby positioning the chip in a normal position. Disposed under each heat buffer plate 103 is a lower electrode plate 105 including emitter electrode post portions 105A each assuming a protruded shape matching with the heat buffer plate 103. A gate substrate 106 for control voltage distribution to the gate electrode of the IGBT chip 101, is provided in a space between the emitter electrode post portions, and a resinous member 107 for fixing the chip is provided above the gate substrate 106. Note that an illustration of a connecting portion between the gate substrate 106 and a chip gate pad is omitted for simplicity in FIG. 9.

The heat buffer plate 108 and an upper electrode plate 109, which are composed of, e.g., molybdenum, are provided upwardly of the chips 101, 102. The heat buffer plate 108 abuts on the collector side of the IGBT chip 101 and on the cathode side of the FRD chip 102, thus connecting these chips in common.

Then, the upper electrode plate and the lower electrode plate are fastened by screws with a compression spring interposed therebetween. With this configuration, the electrodes of the respective chips are efficiently connected, and the heat radiation is efficiently conducted.

Incidentally, the related patent documents are given as follows:

Japanese Patent Publication No. 3256636

Japanese Patent Application Laid-Open Publication No. 2003-7968

As explained above, in the thus constructed press-connected type semiconductor device, the number of the IGBT chips is normally set larger than the number of the FRD chips in order to enhance the current cut-off capability as in the form of the device. Hence, as the number of the FRD chips in one single device is smaller than the number of the IGBT chips, in the case of making an electric current having the same magnitude conductive thereto, an exothermic quantity of the FRD chip is larger than an exothermic quantity of the IGBT chip. In terms of safety, however, it is difficult to reduce the numerical quantity of the IGBT chips because of a necessity for giving a sufficient margin to the current cut-off capacity assured by the semiconductor device. Consequently, there arises a problem in which a power capacity that can be handled by the semiconductor device is restricted mainly by a heat resistance of the FRD chip.

SUMMARY OF THE INVENTION

According to the first aspect of the present invention, there is provided a multi-chip press-connected type semiconductor device comprising:

a plurality of active element chips to control an electric current flowing in one direction;

a plurality of diode chips that transmit the current in a direction opposite to the current transmitting direction of said active element chip; and electrode plates for said active element chip and for said diode chip, said electrode plates pressing from above and under said plurality of active element chips and said plurality of diode chips which are interposed therebetween;

wherein said diode chips are disposed in all of outermost peripheral chip disposing positions respectively having at least one side which is not adjacent to other chips and in internal chip disposing positions surrounded by said outermost peripheral chip disposing positions, and wherein said diode chips are disposed in said internal chip disposing positions in order of total number of other chips from smaller that an observed chip is adjacent to at its side or its vertex.

According to the second aspect of the present invention, there is provided a multi-chip press-connected type semiconductor device comprising:

a plurality of active element chips to control an electric current flowing in one direction;

a plurality of diode chips that transmit the current in a direction opposite to the current transmitting direction of said active element chip; and electrode plates for said active element chip and for said diode chip, said electrode plates pressing from above and under said plurality of active element chips and said plurality of diode chips being interposed therebetween;

wherein said active element chips and said diode chips coexist in outermost peripheral chip disposing positions having at least one side respectively which is not adjacent to other chips, and wherein said diode chips are disposed in the outermost peripheral chip disposing positions in order of total number of other chips from smaller that an observed chip is adjacent to at its side or its vertex.

According to the third aspect of the present invention, there is provided a multi-chip press-connected type semiconductor device comprising:

a plurality of active element chips to control an electric current flowing in one direction;

a plurality of diode chips that transmit the current in a direction opposite to the current transmitting direction of said active element chip;

electrode plates for said active element chip and for said diode chip, said electrode plates pressing from above and under said plurality of active element chips and said plurality of diode chips being interposed therebetween;

wherein said diode chips are disposed in all of outermost peripheral chip disposing positions having at least one side respectively which is not adjacent to other chips and in internal chip disposing positions surrounded by said outermost peripheral chip positions, and wherein said diode chips are disposed in the internal chip disposing positions in order of a heat radiation efficiency from the highest that is determined by a positional relationship with other chips existing in the periphery of an observed chip.

According to the fourth aspect of the present invention, there is provided a multi-chip press-connected type semiconductor device comprising:

a plurality of active element chips to control an electric current flowing in one direction;

a plurality of diode chips that transmit the current in a direction opposite to the current transmitting direction of said active element chip; and electrode plates for said active element chip and for said diode chip, said electrode plates pressing from above and under said plurality of active element chips and said plurality of diode chips being interposed therebetween;

wherein said active element chips and said diode chips coexist in outermost peripheral chip disposing positions having at least one side respectively which is not adjacent to other chips, and wherein said diode chips are disposed in the outermost peripheral chip disposing positions in order of a heat radiation efficiency from the highest that is determined by a positional relationship with other chips existing in the periphery of an observed chip.

According to the fifth aspect of the present invention, there is provided a multi-chip press-connected type semiconductor device comprising:

a plurality of active element chips to control an electric current flowing in one direction;

a plurality of diode chips that transmit the current in a direction opposite to the current transmitting direction of said active element chip; and electrode plates for said active element chip and for said diode chip, said electrode plates pressing from above and under said plurality of active element chips and said plurality of diode chips interposed therebetween;

wherein said diode chips are pressed by a first post portion serving as a pressing device for said diode chip and serving as a current path and said active element chips are pressed by a second post portion serving as a pressing device for said active element chips, the sectional area of said first post portion being larger than that of said second post portion.

According to the sixth aspect of the present invention, there is provided a multi-chip press-connected type semiconductor device comprising: a multi-chip press-connected type semiconductor device comprising: a plurality of active element chips to control an electric current flowing in one direction;

a plurality of diode chips that transmit the current in a direction opposite to the current transmitting direction of said active element chip, and electrode plates for said active element chip and for said diode chip, said electrode plates pressing from above and under with said plurality of active element chips and said plurality of diode chips being interposed therebetween;

wherein a region between posts that press corresponding to said diode chips is formed shallower than regions in other modes.

According to the seventh aspect of the present invention, there is provided a multi-chip press-connected type semiconductor device comprising:

a plurality of chips;

heat buffer plates abutting on said chips; and electrode plates for the chips, said electrode plates pressing from above and under with said plurality of chips being interposed therebetween;

wherein a part of said chip positioned in an outermost peripheral chip position extends outwardly of said heat buffer plate.

BRIEF DESCRIPTION OF THE DRAWINGS

FIGS. 2A through 2H, 2J through 2N, and 2P through 2R are schematic diagrams showing a variety of typical modes of a layout relationship between a target chip and chips adjacent thereto;

DETAILED DESCRIPTION OF THE INVENTION

Embodiments of the present invention will hereinafter be discussed in depth with reference to the drawings.

First Embodiment

A first embodiment of the present invention will be explained by exemplifying a multi-chip type IGBT device.

In the first embodiment, chips are disposed in order from a peripheral position exhibiting a high heat radiation efficiency. To be specific, the chips are disposed in order of adjacent chips from less to more in terms of observing chip-neighboring states in eight peripheral directions.

Figure 1:
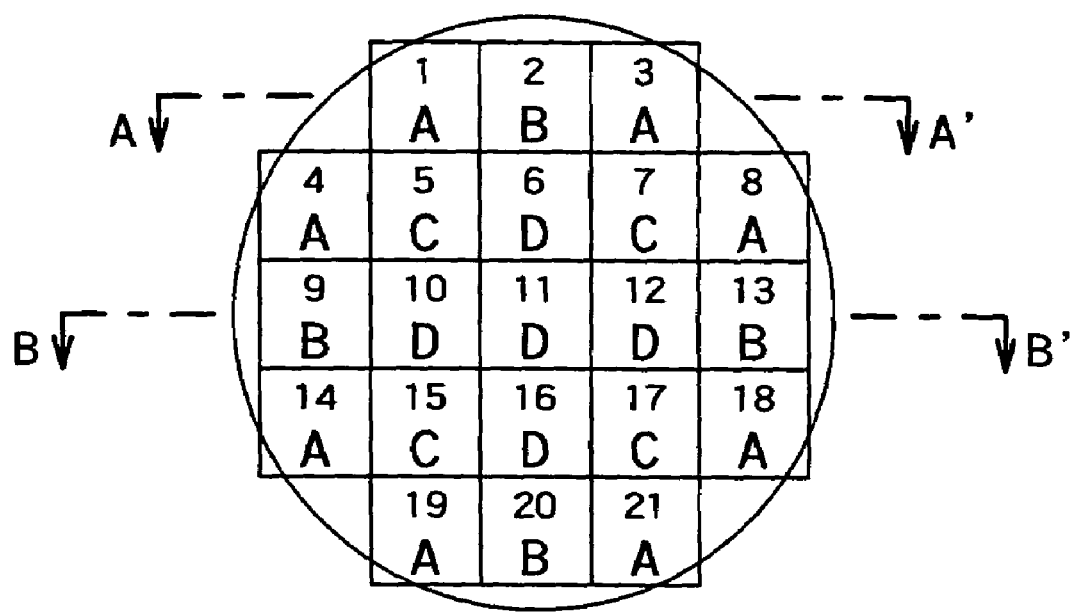
FIG. 1 is a plan view showing the order of disposing IGBT chips and FRD chips in a first embodiment of the multi-chip press-connected type semiconductor device according to the present invention.
Figure 8:
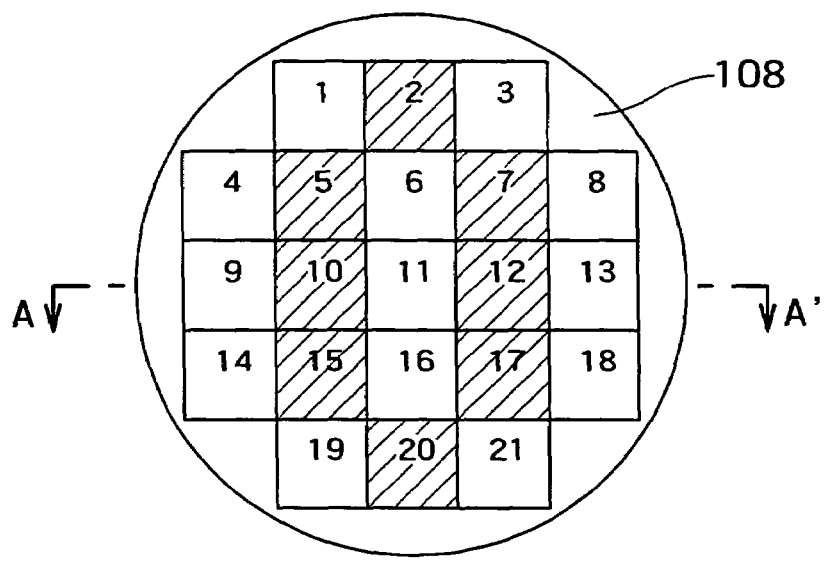
FIG. 8 is a plan view showing how the IGBT chips and the FRD chips are disposed in a multi-chip press-connected type semiconductor device in the prior art.
Figure 9:
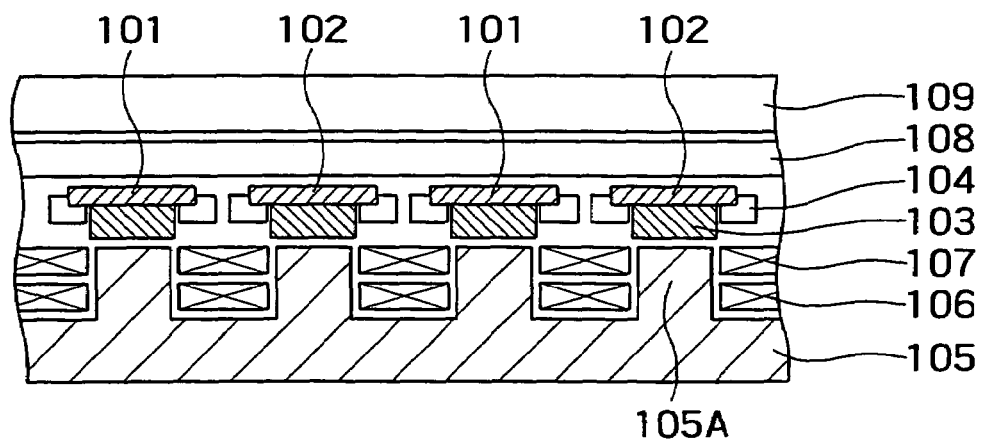
FIG. 9 is a sectional view showing a section taken along the line A–A' in FIG. 8.

FIG. 1 is a plan view showing how the chips are disposed in the first embodiment, wherein twenty-one pieces of layout sections are provided in the same way as in the FIG. 8 illustrating the prior art. Referring to FIG. 1, the layout sections are each given one of alphabets A–D and are grouped into an A-group (embracing positions 1, 3, 4, 8, 14, 18, 19, 21), a B-group (positions 2, 9, 13, 20), a C-group (positions 5, 7, 15, 17) and a D-group (positions 6, 10, 11, 12, 16), which represent the order of the heat radiation efficiency from the highest. Twenty one pieces of chips are disposed in the layout sections respectively.

Accordingly, in the first embodiment, totally eight pieces of diode chips are disposed in the A-group, and totally thirteen pieces of IGBT chips are disposed in the B-, C- and D-groups. This layout, though the same number of diode chips as in the example of the prior art are provided, enables an increase in handling power capacity by a scheme of more efficient heat radiation of the diode chips.

The heat radiation efficiency will hereinafter be described in detail. The heat radiation efficiency should take into account such a point that the heat radiation is hindered if another chip exists in the section adjacent to a target layout section, or it is undergone exothermic influence from another chip. For instance, if another chip is adjacent at its side to the chip concerned, 1 point is decremented from 6 points as a maximum scale, and if adjacent in a diagonal direction at its vertex (a corner), 0.5 point is decremented therefrom. Based on this index, 6 points are given if none of the chips exist in the eight peripheral directions (four sides and four vertexes), and 0 point is given if the chips exist in all the peripheral directions, wherein a higher heat radiation efficiency is exhibited as a higher numeric value is given.

FIGS. 2A through 2R are schematic diagrams showing a variety of typical modes of a layout relationship between the chip concerned and the neighboring chip. Layouts having an enantiomorphic relationship and a rotational relationship with the layout illustrated herein are absolutely equivalent thereto in terms of the heat radiation efficiency.

The followings are the heat radiation efficiencies and explanations of the modes of the layout relationships in FIGS. 2A through 2R.

FIG. 2A shows a case in which the chips are adjacent at one vertex, and the heat radiation efficiency is on the order of 5.5. FIG. 2B shows a case in which the chips are adjacent at one side, and the heat radiation efficiency is 5. FIG. 2C shows a case in which the chips are adjacent at one side and one vertex, and the heat radiation efficiency is 4.5. FIGS. 2D and 2E show cases in which the chips are adjacent at two sides, and the heat radiation efficiency is 4. FIG. 2F shows a case in which the chips are adjacent at one side and two vertexes, and the heat radiation efficiency is 4. FIG. 2G shows a case in which the chips are adjacent at two sides and one vertex, and the heat radiation efficiency is 3.5. FIG. 2H shows a case in which the chips are adjacent at three sides, and the heat radiation efficiency is 3. FIG. 2J shows a case in which the chips are adjacent at two sides and two vertexes, and the heat radiation efficiency is 3. FIG. 2K shows a case in which the chips are adjacent at three sides and one vertex, and the heat radiation efficiency is 2.5. FIG. 2L shows a case in which the chips are adjacent at three sides and two vertexes, and the heat radiation efficiency is 2. FIG. 2M shows a case in which the chips are adjacent at three sides and three vertexes, and the heat radiation efficiency is 1.5. FIG. 2N shows a case in which the chips are adjacent at four sides and two vertexes, and the heat radiation efficiency is 1. FIG. 2P shows a case in which the chips are adjacent at three sides and four vertexes, and the heat radiation efficiency is 1. FIG. 2Q shows a case in which the chips are adjacent at four sides and three vertexes, and the heat radiation efficiency is 0.5. FIG. 2R shows a case in which the chips are adjacent at four sides and four vertexes, and the heat radiation efficiency is 0.

Hence, "A" in FIG. 1 corresponds to the case in FIG. 2J wherein the chips are adjacent at two sides and two vertexes, and the heat radiation efficiency is 3. "B" corresponds to the case in FIG. 2L wherein the chips are adjacent at three sides and two vertexes, and the heat radiation efficiency is 2. "C" corresponds to the case in FIG. 2Q wherein the chips are adjacent at four sides and three vertexes, and the heat radiation efficiency is 0.5. "D" corresponds to the case in FIG. 2R wherein the chips are adjacent at four sides and four vertexes, and the heat radiation efficiency is 0.

Further, on the occasion of laying out the diode chips, the diode chips are arranged in order of the heat radiation efficiency from the highest. Accordingly, if the diode chips are still left even when the diode chips are disposed in all the A-group positions, the remaining diode chips are disposed in the next group positions. The layout scheme is hereafter conducted in the same way.

Moreover, it is required that the diode chips should be set in a layout exhibiting a high symmetry as the whole device. Therefore, if the number of diode chips in a certain group is insufficient, the diode chips are substantially equally disposed in the position of this group. For attaining this, it is preferable that the diode chips be disposed so that centroidal position on the plane where all the diode chips are arrayed as viewed from above, is substantially coincident with a centroidal position on the plane of the whole semiconductor device.

To give one example, if the number of the diode chips is 6, all the eight sections of the A-group are not filled with the diode chips. Hence, in the case of disposing the diode chips at first in the sections 1, 3, 19 and 21, it follows that the remaining two diode chips are disposed in a couple of sections 4 and 18 or a couple of sections 8 and 14 so as to make the centroidal position of the diode chips on the plane substantially coincident with the centroidal position on the plane of the whole semiconductor device.

Further, if the number of the diode chips is 10, all the eight sections of the A-group are filled with the diode chips, and hence the two diode chips are disposed in any two sections among the four sections of the next B-group. In this case, however, these two diode chips are disposed selectively in a couple of sections 2 and 20 or a couple of sections 9 and 13 so as to similarly make the centroidal position of the diode chips on the plane substanctially coincident with the centroidal position on the plane of the whole semiconductor device.

Thus, considering the heat radiation efficiency, the diode chips are disposed at first in the outermost peripheral chip positions in the layout area. After the outermost peripheral chip positions have been filled with the diode chips, the diode chips are arrayed in the internal positions in the order described above. When the active elements and the diode chips coexist in the outermost peripheral chip positions, it follows that the diode chips are arrayed in the order described above.

Second Embodiment

Figure 3:
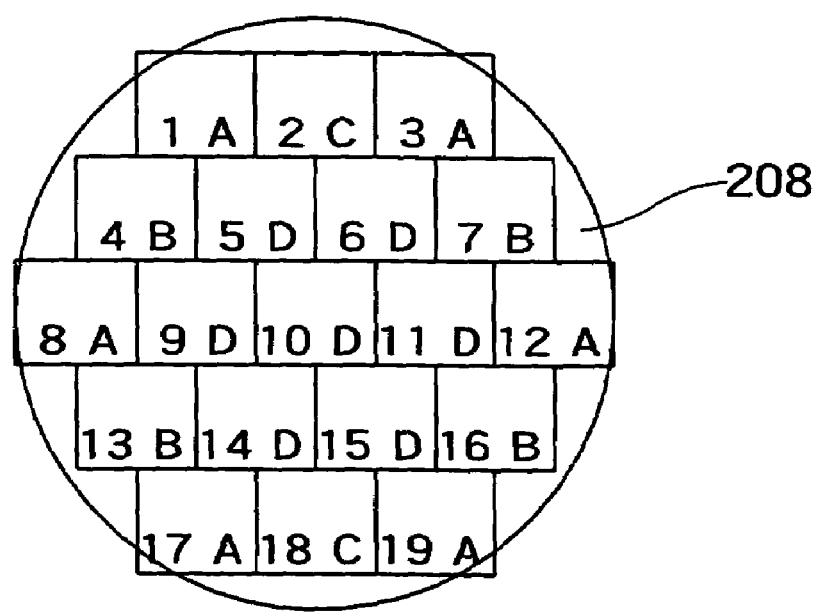
FIG. 3 is a plan view showing the order of disposing the IGBT chips and the FRD chips in a second embodiment of the multi-chip press-connected type semiconductor device according to the present invention.

FIG. 3 is a plan view illustrating a second embodiment of the semiconductor device according to the present invention, and shows a relationship between layout sections and respective chips on a heat buffer disk 208, similarly to FIG. 1.

According to the second embodiment, totally nineteen layout sections are given on the whole by way one example, wherein the number of the chips disposed in respective rows are 3, 4, 5, 4, 3 from the first row down to the fifth row, and the chips are arranged in such an offset state that a lateral pitch in the neighboring row is shifted by half a chip.

In the second embodiment also, as discussed in the first embodiment, the heat radiation efficiency is obtained in a way that uses, as an index, a length of the side of another chip adjacent to the target layout section. Therefore, as shown in FIG. 3, the layout sections are grouped into A, B, C and D in order of the heat radiation efficiency from the highest.

These layout sections, as in the first embodiment, the diode chips are arranged in order of the heat radiation efficiency from the highest and disposed, within the group exhibiting the same heat radiation efficiency, so that the centroidal position of the diode chips gets proximal to the centroidal position of the device.

For instance, supposing that eight pieces of diode chips are provided while eleven pieces of IGBT chips are provided in FIG. 3, the number of layout sections of the A-group exhibiting the best heat radiation efficiency is 6, and therefore, after all the layout sections of this group has been filled with chips, remaining two pieces of chips are disposed in any two sections among four pieces of layout sections of the B-group. In this case, similarly to what has been described in the first embodiment, any one of a couple of sections 4 and 6 and a couple of sections 7 and 13 is selected for ensuring the symmetry.

Note that the pitch is shifted by half a chip in every row in FIG. 3, however, if rotated through 90 degrees, it follows that the pitch is shifted by half a chip in every column, these shifts are equivalent.

The assumption in the first and second embodiments discussed above is that all the sections take square shapes and may take rectangular shapes. In this case, the heat radiation efficiency can be obtained in a way that multiplies by a coefficient corresponding to a length of the side.

Thus, the diode chips are disposed in order of the heat radiation efficiency from the highest in terms of considering the layout situation of other chips in the periphery of the chip concerned, thereby enabling the improvement of the heat radiation efficiency of the diode to be improved and also the increase in the power capacity that can be handled by the device.

Note that the offset state occurs in all the neighboring rows in the embodiments discussed herein and may occur in at least one pair of neighboring rows.

Third Embodiment

Figure 4:
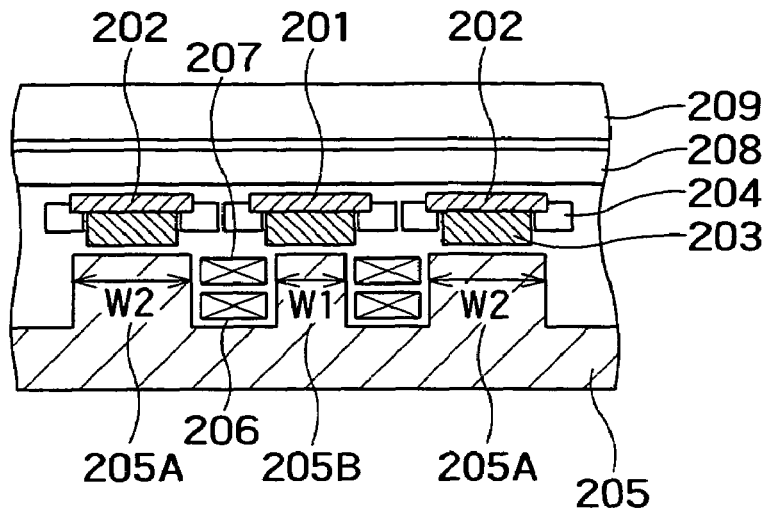
FIG. 4 is a sectional view showing a structure of the multi-chip press-connected type semiconductor device in a third embodiment of the present invention.

FIG. 4 is a sectional view of the multi-chip type IGBT device in a third embodiment of the present invention, and shows a section taken along the line A–A' in FIG. 1. In this area, chip numbers 1 and 3 correspond to FRD chips 202, and a chip number 2 corresponds to an IGBT chip 201. These IGBT chip 201 and FRD chips 202 are respectively mounted on separation type heat buffer plates 203. A collector electrode is provided on an upper surface of the IGBT chip 201, while a cathode electrode is provided on an upper surface of the FRD chip 202. Further, a plastic holder 204 for acquiring a chip-to-chip withstand voltage is fitted into a side terminal portion of each chips, thereby positioning the chip in a normal position.

Disposed under each heat buffer plate 203 is a lower electrode plate 205 including emitter electrode post portions 205A and 205B each assuming a protruded shape matching with the heat buffer plate 203. A different point from the conventional structure shown in FIG. 1 is that a width W2 of the post portion 205A positioned under the FRD chip 202 is wider than a width W1 of the post portion 205B positioned under the IGBT chip 201. Namely, these widths have a relationship such as W2>W1, and sectional areas thereof also have a relationship given by S2>S1.

According to such a structure, an area of a heat radiation route extending from the FRD chip 202 to the lower electrode plate 205 increases, and hence a thermal resistance from the diode to the outside electrode decreases, whereby an allowable power capacity of the device can be augmented.

A gate substrate 206 for control voltage wiring to the gate electrode of the IGBT chip 201, is provided in a space between the emitter electrode post portions, and a resinous member 207 for fixing the chip is provided above the gate substrate 206. The heat buffer plate 208 and an upper electrode plate 209, which are composed of, e.g., molybdenum, are provided upwardly of the chips 201, 202. A preferable connection between the parts is attained by finally performing the pressurization. These points are the same as those in the multi-chip press-connected type semiconductor device exemplified by way of the example of the prior art.

The third embodiment is applied to the multi-chip press-connected type semiconductor device in the first embodiment illustrated in FIG. 1, and can also be applied to the multi-chip press-connected type semiconductor device based on the structure in the example of the prior art.

Fourth Embodiment

Figure 5:
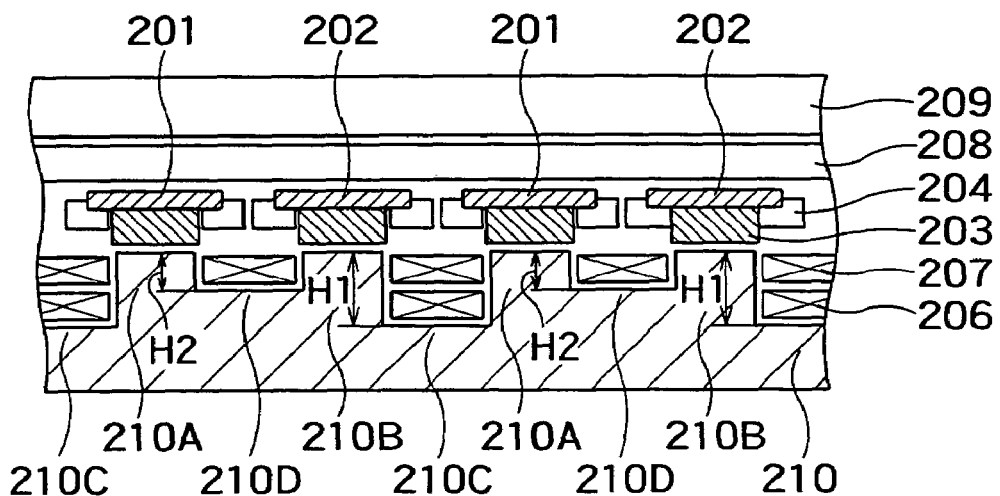
FIG. 5 is a sectional view showing a structure of the multi-chip press-connected type semiconductor device in a fourth embodiment of the present invention.

FIG. 5 is a sectional view showing a structure of the multi-chip press-connected type semiconductor device in a fourth embodiment of the present invention, and shows a section taken along the line B–B' in FIG. 1. In the fourth embodiment, as compared with the third embodiment shown in FIG. 4, the width of each post is fixed, however, there decreases a height of at least one side among the four sides of a protruded portion of an internal metal post for connecting the FRD chip by pressure. This structure can be attained by providing none of the gate substrate at that portion.

To describe in depth with reference to FIG. 5, in a lower electrode plate 210, a downward post 210A of an IGBT chip 201 has a left-sided height H1 and a right-sided height H2 lower than H1 in FIG. 5, and a downward post 210B of an FRD chip 202 has a left-sided height H2 and a right-sided height H1. Accordingly, a shallow recessed portion having the depth H2 and a deep recessed portion having a depth H1 are alternately formed between those posts.

The shallow recessed portion can be actualized by providing no gate wiring substrate for FRD. A connection of gate wiring to the IGBT may be established by use of other posts in an unillustrated area by utilizing other gate wiring. Owing to this structure, the heat radiation route extending from the FRD chip 202 to the outside of the electrode plate 210 is expanded, and the heat resistance from the diode to the outside electrode decreases. Therefore, as in the third embodiment, the allowable power capacity of the device can be increased.

Fifth Embodiment

A fifth embodiment of the present invention will be explained referring to FIGS. 1, 6 and 7.

FIG. 1 shows the state in which some portions of the peripheral chips positioned in the sections 1, 3, 4, 8, 14, 18, 19 and 21 are more protruded than the heat buffer plate 208 within the device as viewed from the plane but do not abut on the heat buffer plate 208.

Figure 6:
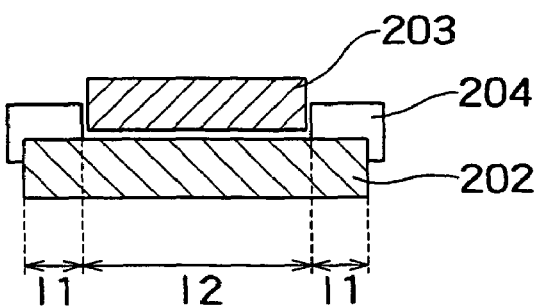
FIG. 6 is a sectional view showing a structure of the multi-chip press-connected type semiconductor device in a fifth embodiment of the present invention.

FIG. 6 is a front view showing a relationship between the FRD chip 202, a buffer plate 203 and a chip protection resinous member 204. Note that FIG. 6 shows the structure inverted in the vertical direction as opposite to those in FIGS. 4 and 5 for the convenience's sake.

The FRD chip 202 on which the heat is emitted has a region L1 for obtaining a withstand voltage of the chip peripheral portion and a region L2 for contributing to the current conduction. Then, the chip protection resinous member 204 for protecting the periphery of the chip is attached to its peripheral portion. The heat radiation is effected mainly in the region L2 for contributing to the current conduction, and in fact an anode side of the FRD chip is provided with a heat buffer plate abutting on the region L2. Hence, lengthwise portions of the respective regions L1 at both ends in an entire length (2L1+L2) of the chip do not contribute to the heat radiation so much.

The peripheral potion of the heat buffer plate 208 has hitherto been surrounded with the resin for holding the buffer plate, and the resin is fixed to a resin 207 for holding the chip. Therefore, if the conventional structure remains unchanged, the chip is unable to extrude from the heat buffer plate 208.

Figure 7:
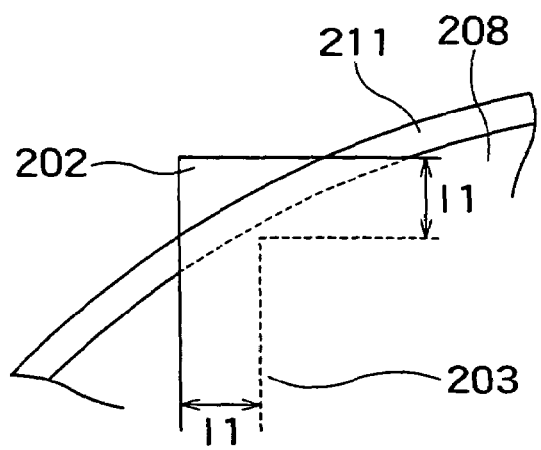
FIG. 7 is a front view showing a positional relationship between a FRD chip 202, a buffer plate 203 and a buffer plate 208.

According to the fifth embodiment, however, as shown in FIG. 7, a part of the FRD chip is extended beyond a range of the heat buffer plate 208 by decreasing, to the greatest possible degree, thickness of the protection resinous member 211 attached to the peripheral portion of the heat buffer plate 208 and by making an edge of the heat buffer plate 203 proximal to an internal edge of the protection resinous member 211.

By taking the structure described above, in an envelope having the same size or in the device having the heat buffer plate, the size of the chip mounted thereon can be made larger than by the prior art, and the current conduction area can be enlarged, thereby making it possible to increase the power capacity of the whole device.

Note that the device in which a part of the peripheral chip is extended outwardly of the heat buffer plate is not limited to the type in which to coexist the diode, the active element for the power control such as the IGBT and the diode for current permission in the reversed direction, and can be similarly applied to a type of being mounted with only the active elements or only the diode chips.

As discussed above, in the multi-chip press-connected type semiconductor device of the type wherein there are disposed the plurality of active element chips for controlling the one-directionally flowing current and the plurality of diode chips that transmit the current in the direction opposite to the current transmitting direction of the active element chip, and the electrode plates of the active element chip and of the diode chip are connected by pressure from above and under, when the diode chips are disposed in all of outermost peripheral chip positions region with no-existence of other chips adjacent to at least one side of a certain chip in a chip disposing region, and when the diode chips are disposed also in internal layout positions, the diode chips are arranged in order of a total number of other chips from the smallest that exist adjacently to at least one of a side and a vertex of a target diode chip in the internal layout position or in order of a heat radiation efficiency from the highest; and, when the active element chips and the diode chips coexist in the outermost peripheral chip positions, the diode chips existing in the outermost peripheral chip positions are arranged for the next time in order of a total number of other chips from the smallest that exist adjacently to at least one of a side and a vertex of a target diode chip or in order of a heat radiation efficiency from the highest. Hence, it follows that the diode elements in the device are arranged in the positions in order of the heat radiation efficiency from the highest, thereby making it possible to improve the heat radiation efficiency of the diode and to increase a power capacity that can be handled by the device higher than by the prior art.

Further, in the multi-chip type semiconductor device, a heat resistance from a FRD chip to an outside electrode can be reduced by enlarging an area of press-connected posts corresponding to the diode chips, an electric current that can be flowed across the FRD chips can be increased, and the power capacity of the device can be improved.

Moreover, in the multi-chip press-connected semiconductor device, much larger elements can be mounted by extending some portions of the chips existing in the outermost peripheral chip positions outwardly of the heat buffer plates, whereby the power capacity of the device can be augmented.

What is claimed is:

1. A multi-chip press-connected type semiconductor device comprising:
   a plurality of active element chips to control an electric current flowing in one direction;

a plurality of diode chips that transmit the current in a direction opposite to the current transmitting direction of said active element chip; and electrode plates for said active element chip and for said diode chip, said electrode plates pressing from above and under said plurality of active element chips and said plurality of diode chips which are interposed therebetween;

wherein said diode chips are disposed in all of outermost peripheral chip disposing positions respectively having at least one side which is not adjacent to other chips and in internal chip disposing positions surrounded by said outermost peripheral chip disposing positions, and wherein said diode chips are disposed in said internal chip disposing positions in order of total number of other chips from smaller that an observed chip is adjacent to at its side or its vertex.

2. The multi-chip press-connected type semiconductor device according to claim 1, wherein said diode chips are disposed so that a centroidal position, on the plane, of all of said diode chips disposed as viewed from above, is substantially coincident with a centroidal position, on the plane, of said whole semiconductor device.

3. The multi-chip press-connected type semiconductor device according to claim 1, wherein said plurality of active element chips and said plurality of diode chips are arrayed in matrix so that sides of said diode chips face the sides of the active element chips adjacent to each other in entire lengths of the chips in a direction of either a row or a column.

4. The multi-chip press-connected type semiconductor device according to claim 1, wherein said plurality of active element chips and said plurality of diode chips are so arranged as to be shifted by a half a chip in at least one pair of adjacent rows or columns.

5. A multi-chip press-connected type semiconductor device comprising:
a plurality of active element chips to control an electric current flowing in one direction;
a plurality of diode chips that transmit the current in a direction opposite to the current transmitting direction of said active element chip; and
electrode plates for said active element chip and for said diode chip, said electrode plates pressing from above and under said plurality of active element chips and said plurality of diode chips being interposed therebetween;
wherein said active element chips and said diode chips coexist in outermost peripheral chip disposing positions having at least one side respectively which is not adjacent to other chips, and
wherein said diode chips are disposed in the outermost peripheral chip disposing positions in order of total number of other chips from smaller that an observed chip is adjacent to at its side or its vertex.

6. The multi-chip press-connected type semiconductor device according to claim 5, wherein said diode chips are disposed so that a centroidal position, on the plane, of all of said diode chips disposed as viewed from above, is substantially coincident with a centroidal position, on the plane, of said whole semiconductor device.

7. The multi-chip press-connected type semiconductor device according to claim 5, wherein said plurality of active element chips and said plurality of diode chips are arrayed in matrix so that sides of said diode chips face the sides of the active element chips adjacent to each other in their entire lengths in a direction of either a row or a column.

8. The multi-chip press-connected type semiconductor device according to claim 5, wherein said plurality of active element chips and said plurality of diode chips are so arranged as to be shifted by a half a chip in at least one pair of adjacent rows or columns.

9. A multi-chip press-connected type semiconductor device comprising:
a plurality of active element chips to control an electric current flowing in one direction;
a plurality of diode chips that transmit the current in a direction opposite to the current transmitting direction of said active element chip;
electrode plates for said active element chip and for said diode chip, said electrode plates pressing from above and under said plurality of active element chips and said plurality of diode chips being interposed therebetween;
wherein said diode chips are disposed in all of outermost peripheral chip disposing positions having at least one side respectively which is not adjacent to other chips and in internal chip disposing positions surrounded by said outermost peripheral chip positions, and
wherein said diode chips are disposed in the internal chip disposing positions in order of a heat radiation efficiency from the highest that is determined by a positional relationship with other chips existing in the periphery of an observed chip.

10. The multi-chip press-connected type semiconductor device according to claim 9, wherein the heat radiation efficiency is so defined as to become higher as the total number of other chips adjacent to the side and the vertex of the observed chip becomes smaller.

11. The multi-chip press-connected type semiconductor device according to claim 9, wherein the heat radiation efficiency is so evaluated as to be weighted smaller in the case of being adjacent to the vertex than in the case of being adjacent to the side.

12. The multi-chip press-connected type semiconductor device according to claim 9, wherein said diode chips are disposed so that a centroidal position, on the plane, of all of said diode chips disposed as viewed from above, is substantially coincident with a centroidal position, on the plane, of said whole semiconductor device.

13. The multi-chip press-connected type semiconductor device according to claim 9, wherein said plurality of active element chips and said plurality of diode chips are arrayed in matrix so that sides of said diode chips face the sides of the active element chips adjacent to each other in their entire lengths in a direction of either a row or a column.

14. The multi-chip press-connected type semiconductor device according to claim 9, wherein said plurality of active element chips and said plurality of diode chips are so arranged as to be shifted by a half a chip in at least one pair of adjacent rows or columns.

15. A multi-chip press-connected type semiconductor device comprising:
a plurality of active element chips to control an electric current flowing in one direction;
a plurality of diode chips that transmit the current in a direction opposite to the current transmitting direction of said active element chip; and
electrode plates for said active element chip and for said diode chip, said electrode plates pressing from above and under said plurality of active element chips and said plurality of diode chips being interposed therebetween;

wherein said active element chips and said diode chips coexist in outermost peripheral chip disposing positions having at least one side respectively which is not adjacent to other chips, and wherein said diode chips are disposed in the outermost peripheral chip disposing positions in order of a heat radiation efficiency from the highest that is determined by a positional relationship with other chips existing in the periphery of an observed chip.

16. The multi-chip press-connected type semiconductor device according to claim 15, wherein the heat radiation efficiency is so defined as to become higher as the total number of other chips adjacent to the side and the vertex of the chip becomes smaller.

17. The multi-chip press-connected type semiconductor device according to claim 15, wherein the heat radiation efficiency is so evaluated as to be weighted smaller in the case of being adjacent to the vertex than in the case of being adjacent to the side.

18. The multi-chip press-connected type semiconductor device according to claim 15, wherein said diode chips are disposed so that a centroidal position, on the plane, of all of said diode chips disposed as viewed from above, is substantially coincident with a centroidal position, on the plane, of said whole semiconductor device.

19. The multi-chip press-connected type semiconductor device according to claim 15, wherein said plurality of active element chips and said plurality of diode chips are arrayed in matrix so that sides of said diode chips face the sides of the active element chips adjacent to each other in their entire lengths in a direction of either a row or a column.

20. The multi-chip press-connected type semiconductor device according to claim 15, wherein said plurality of active element chips and said plurality of diode chips are so arranged as to be shifted by a half a chip in at least one pair of adjacent rows or columns.

21. A multi-chip press-connected type semiconductor device comprising:

a plurality of active element chips to control an electric current flowing in one direction;

a plurality of diode chips that transmit the current in a direction opposite to the current transmitting direction of said active element chip; and electrode plates for said active element chip and for said diode chip, said electrode plates pressing from above and under said plurality of active element chips and said plurality of diode chips interposed therebetween;

wherein said diode chips are pressed by a first post portion serving as a pressing device for said diode chip and serving as a current path and said active element chips are pressed by a second post portion serving as a pressing device for said active element chips, the sectional area of said first post portion being larger than that of said second post portion.

22. A multi-chip press-connected type semiconductor device comprising:

a plurality of active element chips to control an electric current flowing in one direction;

a plurality of diode chips that transmit the current in a direction opposite to the current transmitting direction of said active element chip, and upper and lower electrode plates for said active element chip and for said diode chip, said electrode plates pressing from above and under with said plurality of active element chips and said plurality of diode chips being interposed therebetween;

wherein said diode chips and said active element chips are respectively pressed by post portions serving as a pressing device, and regions between said post portions are provided in said lower electrode plate such that a shallow recess portion and a deep recess portion are arranged alternately.

23. The multi-chip press-connected type semiconductor device according to claim 22, wherein a gate wiring substrate is not provided in said shallow recess portion.

24. A multi-chip press-connected type semiconductor device comprising:

an array of chips having a set of chips positioned in an outermost peripheral array position;

a heat buffer plate abutting on said array of chips; and electrode plates for the chips, said electrode plates pressing from above and under with said array of chips being interposed therebetween;

wherein a part of each chip of a subset of chips of said set of chips positioned in said outermost peripheral array position extends outwardly of said heat buffer plate.

* * * * *